United States Patent
Naseef

(10) Patent No.: US 10,416,218 B2
(45) Date of Patent: Sep. 17, 2019

(54) TESTING SYSTEM FOR PERFORMING MULTIPACTION TESTS ON A DEVICE UNDER TEST AS WELL AS A METHOD FOR TESTING A DEVICE UNDER TEST

(71) Applicant: Rohde & Schwarz GmbH & Co. KG, Munich (DE)

(72) Inventor: Mahmud Naseef, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 14 days.

(21) Appl. No.: 15/421,138

(22) Filed: Jan. 31, 2017

(65) Prior Publication Data
US 2018/0217194 A1 Aug. 2, 2018

(51) Int. Cl.
| G01R 29/00 | (2006.01) |
| G01R 31/28 | (2006.01) |
| G01R 29/26 | (2006.01) |
| H04B 17/00 | (2015.01) |

(52) U.S. Cl.
CPC ............ *G01R 29/26* (2013.01); *G01R 29/00* (2013.01); *G01R 31/2822* (2013.01); *H04B 17/0085* (2013.01)

(58) Field of Classification Search
CPC ........ H04B 1/00; H04B 2201/00; G01R 1/00; H04W 4/00
See application file for complete search history.

(56) References Cited

U.S. PATENT DOCUMENTS

| 5,180,985 A | 1/1993 | Zoccarato et al. |
| 2008/0191949 A1* | 8/2008 | Rao ........................ G01R 29/10 343/703 |
| 2009/0261926 A1* | 10/2009 | Wolk .................... H01P 11/002 333/99 MP |
| 2009/0262037 A1* | 10/2009 | Matyas .................. H01Q 19/12 343/779 |

(Continued)

FOREIGN PATENT DOCUMENTS

KR  100693315 B1  3/2007

OTHER PUBLICATIONS

Clancy P.F.: "Multipactor Control in Microwave Space Systems", Microwave J., vol. 21, No. 3, Mar. 1, 1978, XP001403025.

(Continued)

*Primary Examiner* — Jermele M Hollington
*Assistant Examiner* — Temilade S Rhodes-Vivour
(74) *Attorney, Agent, or Firm* — Schwabe, Williamson & Wyatt, P.C.

(57) ABSTRACT

A testing system is described, wherein said testing system is configured to perform a multipaction test on a device under test. Said testing system comprises a signal generation unit being configured to stimulate an input of said device under test, a receiving unit being configured to receive and measure at least one output signal of said device under test in order to obtain data related to a multipaction occurrence. Said signal generation unit and said receiving unit are controlled such that both units are operated simultaneously. Said signal generation unit is configured to generate a testing signal for stimulating said input, said testing signal comprising at least two carriers simultaneously. Further, a method for testing a device under test is described.

20 Claims, 2 Drawing Sheets

(56) References Cited

U.S. PATENT DOCUMENTS

| | | | |
|---|---|---|---|
| 2013/0061914 A1* | 3/2013 | Young | H01L 31/02021 136/252 |
| 2014/0154997 A1* | 6/2014 | Chen | H04B 3/46 455/67.14 |
| 2015/0160279 A1* | 6/2015 | Zhou | G01R 29/26 324/626 |
| 2016/0103166 A1* | 4/2016 | Szafraniec | G01R 27/28 324/638 |

OTHER PUBLICATIONS

Belda O. Monerris et al: "Multipactor testing and emerging qualification protocols", 2016 46th European Microwave Conference (EUMC), Oct. 4, 2016; XP033045334.

* cited by examiner

TESTING SYSTEM FOR PERFORMING MULTIPACTION TESTS ON A DEVICE UNDER TEST AS WELL AS A METHOD FOR TESTING A DEVICE UNDER TEST

TECHNICAL FIELD

The invention relates to a testing system for performing multipaction tests on a device under test as well as a method for testing a device under test.

BACKGROUND

In the state of the art, pre-launch testing of satellites, in particular their payloads, is known wherein several different tests are performed. It has been turned out that multipaction occurrence is a further test item that has to be performed during pre-launch testing of satellites wherein these tests are typically performed inside a thermal vacuum chamber (TVAC).

Multipaction (multipactor effect) is an electron resonance effect in vacuum conditions such as space when a local radio frequency field accelerates electrons such that these electrons impact with a surface. If the energy of these electrons is high enough, their collisions with the surface will lead to a release of so called secondary electrons. Each of the newly released secondary electrons follows the same pattern of the initial electron. Accordingly, this may result in an exponential rise of the number of electrons, in particular in case of a sustained multiplication, as secondary electron emission in resonance with an alternating electric field leads to an exponential multiplication of the electrons.

In radio frequency space systems, the multipactor effect may lead to the degradation of the radio frequency signal by increased noise that is generated by the secondary electrons. Further, damage to radio frequency components or subsystems of the space system will occur if local radio frequency power increases sufficiently since the number of electrons rise.

In general, the multipactor effect is a phenomenon that occurs in devices where high electrical field strength are common such as high power travelling wave tube amplifiers (TWTA), high power waveguides and waveguide components such as diplexers and filters. However, multipaction needs to be minimal and tested against margin.

During pre-launch testing of the satellite within the thermal vacuum chamber, the exponential rise of the number of electrons may cause an operational failure. In addition, the multipaction might damage or even destroy the radio frequency components of the satellite and/or the testing system.

Thus, there is a need for a testing method as well as a testing system that ensure proper work during the testing without damaging the testing components or the device under test.

SUMMARY OF THE INVENTION

The invention provides a testing system, wherein said testing system is configured to perform a multipaction test on a device under test, said testing system comprising:
 a signal generation unit being configured to stimulate an input of said device under test,
 a receiving unit being configured to receive and measure at least one output signal of said device under test in order to obtain data related to a multipaction occurrence,
 said signal generation unit and said receiving unit being controlled such that both units are operated simultaneously, said signal generation unit being configured to generate a testing signal for stimulating said input, said testing signal comprising at least two carriers simultaneously.

The invention further provides a method for testing a device under test, wherein a multipaction test is performed, with the following steps:
 a) Generating a testing signal for stimulating an input of said device under test, said testing signal being generated by a signal generation unit,
 b) Receiving and measuring at least one output signal of said device under test by using a receiving unit, wherein
 said signal generation unit and said receiving unit are operated simultaneously, said signal generation unit generating a testing signal that comprises at least two carriers simultaneously.

The invention is based on the finding that the occurrence of multipaction can be identified at an early stage during testing while a testing signal is used that comprises at least two different carriers simultaneously being almost static instead of a swept signal, for instance a continuous wave swept signal or an amplitude modulated swept signal. The at least two different carriers of the testing signal are spaced with respect to each other by a gap. Thus, the testing signal has a distinct almost static characteristic as at least two peaks corresponding to the at least two carriers are provided with regard to the power level of the testing signal. The output signal of the device under test received by the receiving unit may have a similar characteristic provided that no multipactor effect occurs that would alter the power characteristics. However, in case of the occurrence of multipaction, the characteristics of the output signal will be different. This different characteristic can be measured and interpreted as the occurrence of the resonance (multipactor) effect during testing.

The signal generation unit may be configured to generate wideband multi tone signals. Thus, the testing signal can have multiple carriers such that a multi-carrier signal is used as a testing signal. Particularly, the multi tone signals are flat which means that the multi tone signals have a flat frequency response. Thus, the carriers substantially do not vary with respect to frequency.

According to an aspect said at least one output signal comprises at least two carriers simultaneously. Thus, the output signal that is received by the receiving unit also comprises both carriers such that the output signal normally has the same characteristics as the testing signal. Provided that multipaction occurs, the gap between both peaks with regard to the power level will be filled up by the energy of the secondary electrons that are released.

According to another aspect, an analyzing unit is provided, said analyzing unit being connected to said receiving unit. Particularly, said at least one output signal is analyzed by an analyzing unit. Thus, the output signal received by the receiving unit is directly forwarded to the analyzing unit for analyzing purposes. For instance, the analyzing unit analyzes the gap between the at least two carriers of the output signal of the device under test in order to identify the power level between both carriers. As the gap between both carriers with regard to frequency will fill up provided that multipaction occurs, the occurrence can be identified easily during the testing while analyzing the gap.

Particularly, said analyzing unit is configured to analyze at least two carriers simultaneously. Thus, the multipaction test can be used for testing the device under test with regard to further aspects, for instance during a pre-launch test of a satellite. In addition, the analyzing unit is configured to analyze at least a frequency span that ranges from one carrier to the next one. Accordingly, the occurrence of a multipaction effect can be identified easily as the span defined by both carriers is analyzed.

According to a certain embodiment, at least one of said analyzing unit and said receiving unit is configured to be operated in real time. This means that said analyzing unit and/or said receiving unit have/has a real time mode such that the output signal can be measured and analyzed directly without the need of finishing or stopping the testing of the device under test. Accordingly, it is possible to detect an occurrence of multipaction during the testing such that the testing can be stopped or interrupted immediately in order to prevent the device under test and/or the testing system from any damage.

Further, at least one threshold value may be provided in at least one of said analyzing unit and said receiving unit, said threshold value being a power level for multipaction. Accordingly, said testing system is configured to identify the occurrence of a multipaction effect due to the threshold value automatically provided that the threshold value is reached or exceeded. Particularly, at least one threshold value is used for identifying an occurrence of multipaction during testing, said threshold value being a power level. Accordingly, the testing method also provides the information regarding the occurrence of a multipaction effect due to the fact that the threshold value can be used. As the receiving unit already measures the output signal, the receiving unit may detect the occurrence of the multipaction effect at an early stage, in particular prior to forwarding the measured signal to the analyzing unit for analyzing purposes. The occurrence can be identified easily by referring to the power level as the second electrons released will raise the power level between the carriers in the output signal received.

According to another aspect a warning is output when said threshold value is reached or exceeded. Thus, the user operating the testing system is informed about the occurrence of a multipaction effect due to the threshold value being at least reached. As the raising energy caused by the multipaction effect may harm the testing system or the device under test, in particular the satellite and its payload, the user can react and stop the test procedure appropriately due to the warning.

Moreover, said testing may be stopped when said threshold value is reached or exceeded. Thus, the user does not have to interact since the testing is stopped automatically. For instance, the testing system is configured to be shut down automatically in case the threshold value is reached or exceeded.

Generally, two different threshold values may be provided, a first threshold value being related to a warning and a second threshold value being related to a stopping of the testing (system). Thus, the user of the testing system will be warned initially in order to sustain his attention and the testing will be stopped if the second threshold value is reached or exceeded for security purposes.

According to a certain embodiment, an indication unit is provided that is configured to trigger the power level with regard to said threshold value during testing, in particular wherein said indication unit is configured to stop said testing system. Thus, the testing is stopped once the threshold value is reached or exceeded for limiting the testing time and safety purposes with regard to the electronics of the device under test and the testing system. This indication unit may comprise a display showing the threshold value such that the user of the testing system can identify the crossing of the threshold value visually.

Moreover, said testing signal generated may have a bandwidth of at least 2 GHz, in particular 2.5 GHz and more. Thus, broadband signals can be used for testing the device under test, for instance a satellite and its payload Particularly, said signal generation unit is configured to adjust a gap provided between said at least two carriers. Thus, an adjustable gap may be set while generating said testing signal, said adjustable gap being provided between said at least two carriers of said testing signal. Accordingly, the frequency of the carriers can be set appropriately such that the testing signal is generated with regard to the parameters set. These parameters may be the frequencies of both carriers and/or the gap provided between both carriers. Two of these three parameters already define the testing signal that is used for the multipaction testing.

According to another aspect, said signal generation unit is configured to generate an amplitude modulated signal used as said testing signal. Accordingly, several useful signals can be used without any disturbing interferences with respect to each other.

Furthermore, at least one condition changing unit may be provided that is configured to change a condition for testing said device under test, in particular during testing said device under test. The condition changing unit may be established by a temperature changing unit or a pressure changing unit that changes the temperature and pressure, respectively. Accordingly, at least one testing condition can be set for said testing or changed during said testing, in particular the temperature and/or the pressure. Thus, a certain test scenario may be provided wherein pressure and temperature are set. Moreover, these testing parameters can be varied during the testing of the device under test, for instance the satellite, in particular its payload. These varying conditions may be part of the testing scenario.

In addition, said testing system may comprise a device under test, in particular wherein said device under test is a satellite.

Particularly, said testing system is configured to perform a method as described above.

BRIEF DESCRIPTION OF THE DRAWINGS

The invention will now be described with reference to a preferred embodiment which is shown in the drawings. In the drawings, FIG. 1 schematically shows a testing system according to the invention.

DETAILED DESCRIPTION

Figure 1:
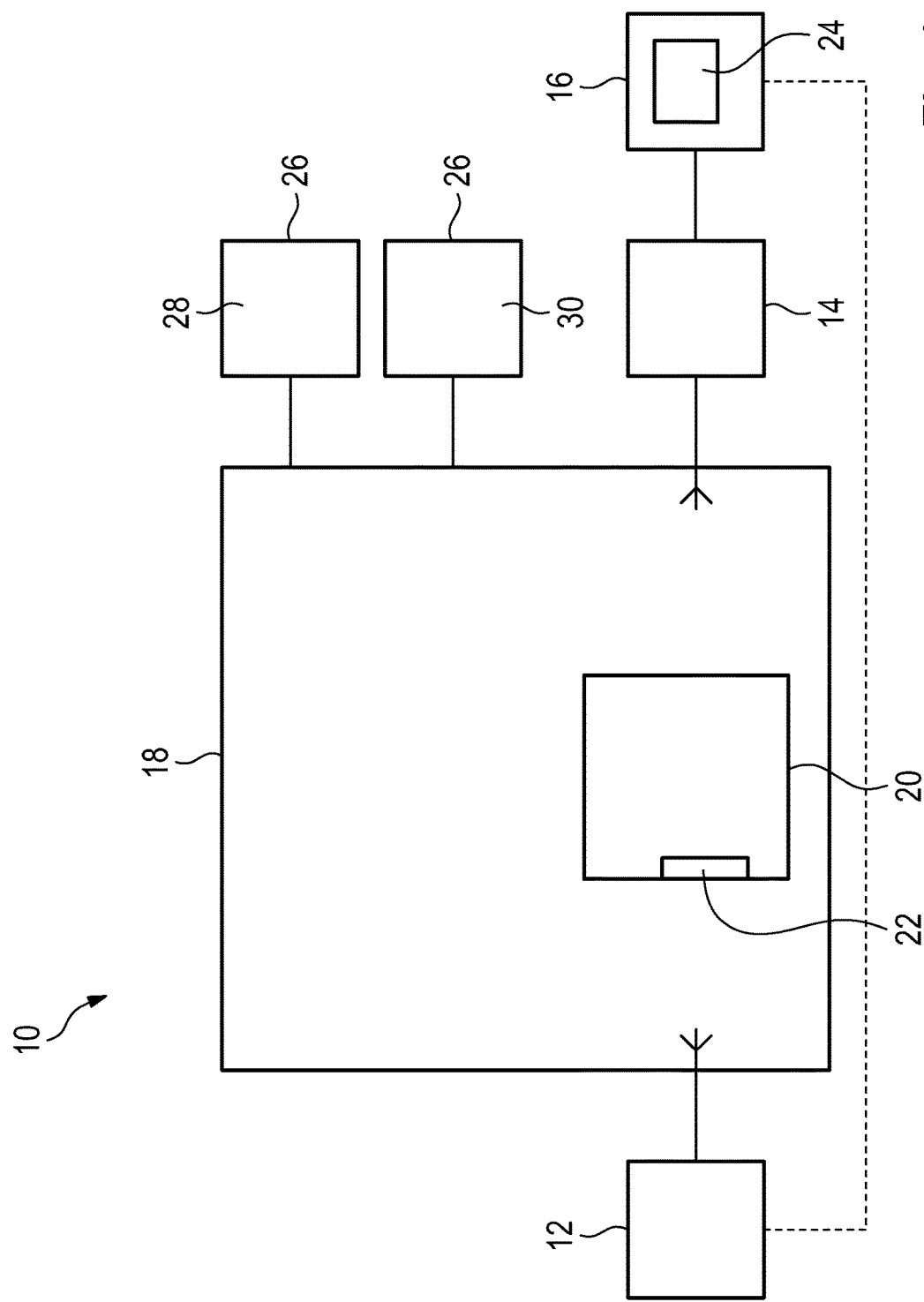

In FIG. 1, a testing system 10 for performing multipaction tests on a device under test is shown, in particular a satellite with a payload.

In the shown embodiment, the testing system 10 comprises a signal generation unit 12, a receiving unit 14, and an analyzing unit 16. These different units 12 to 16 each are formed separately to each other whereas these three units 12 to 16 may alternatively be established in a common device at least partly. For instance, the receiving unit 14 and the analyzing unit 16 may be formed integrally.

In the shown embodiment, the testing system 10 comprises a thermal vacuum chamber 18 that is used for testing a device under test 20 that is positioned in the thermal vacuum chamber 18.

The signal generation unit 12 is configured to generate a testing signal that is fed into the thermal vacuum chamber 18 such that the testing signal is used to stimulate the device under test 20, in particular an input 22 of the device under test 20. In the shown embodiment, the device under test 20 is established by a satellite having a payload. The device under test 20 may be part of the testing system 10.

The testing signal generated by the signal generation unit 12 is forwarded to the device under test 20 which the testing signal such that an output signal is generated which is received and measured by the receiving unit 14.

Thus, the signal generation unit 12 and the receiving unit 14 are directly assigned to the thermal vacuum chamber 18 accommodating the device under test 20. Particularly, the signal generation unit 12 comprises a transmission antenna system for transmitting the testing signal generated whereas the receiving unit 14 has a receiving antenna system for receiving the output signal of the device under test 20.

The receiving unit 14 is assigned to the analyzing unit 16 that is configured to analyze the output signal forwarded. For instance, the receiving unit 14 may be directly connected to the device under test 20 wherein a connecting line can be used.

This testing system 10 is configured to perform a multipaction test in order to verify and analyze the occurrence of multipaction (multipactor effect).

For this purpose, the signal generation unit 12 generates a testing signal that comprises at least two carriers simultaneously. Particularly, a wideband multi-tone signal is generated that is used as the testing signal. Further, the testing signal may be an amplitude modulated signal. The testing signal generated has a flat frequency response ensuring that the carriers have the frequency intended.

The testing signal that is processed by the device under test 20 comprises at least two different peaks in a power level diagram that illustrates the power level of the testing signal with respect to the frequency. As the multi tone testing signal comprises several carriers, a gap is provided between adjacent carriers with regard to the power level provided that no multipaction occurs. The signal generation unit 12 is configured to set the testing signal. Thus, the frequency of the carriers and/or the gap between the carriers may be set by the user of the testing system 10.

The output signal of the device under test 20 that is received by the receiving unit 14 also comprises these multiple carriers. The analyzing unit 16 is configured to analyze at least two carriers simultaneously, in particular a frequency span provided by two adjacent carriers. For instance, the carriers of the testing signal are used for further testing purposes. Thus, these testing purposes can be analyzed simultaneously while performing a multipaction test.

In general, the signal generation unit 12, the receiving unit 14 as well as the analyzing unit 16 are operated simultaneously such that the testing signals are generated while the output signals of the device under test 20 are measured and analyzed at the same time.

Further, the receiving unit 14 and the analyzing unit 16 are configured to be operated in real time which means that both units 14, 16 have a real time mode. This ensures that the measuring and/or analyzing results can be provided directly during the testing.

Generally, an indication unit 24 may be provided that can be used for indicating the occurrence of multipaction.

In the shown embodiment, the indication unit 24 is part of the analyzing unit 16 since the analyzing unit 16 can be used for displaying the spectrum of the output signal, particularly in real time.

Alternatively, the indication unit 24 may be formed separately with respect to the analyzing unit 16. For instance, the indication unit 24 can be used solely such that the receiving unit 14 is directly connected to the indication unit 24, in particular wherein the indication unit 24 is configured to display the data obtained.

Figure 2:
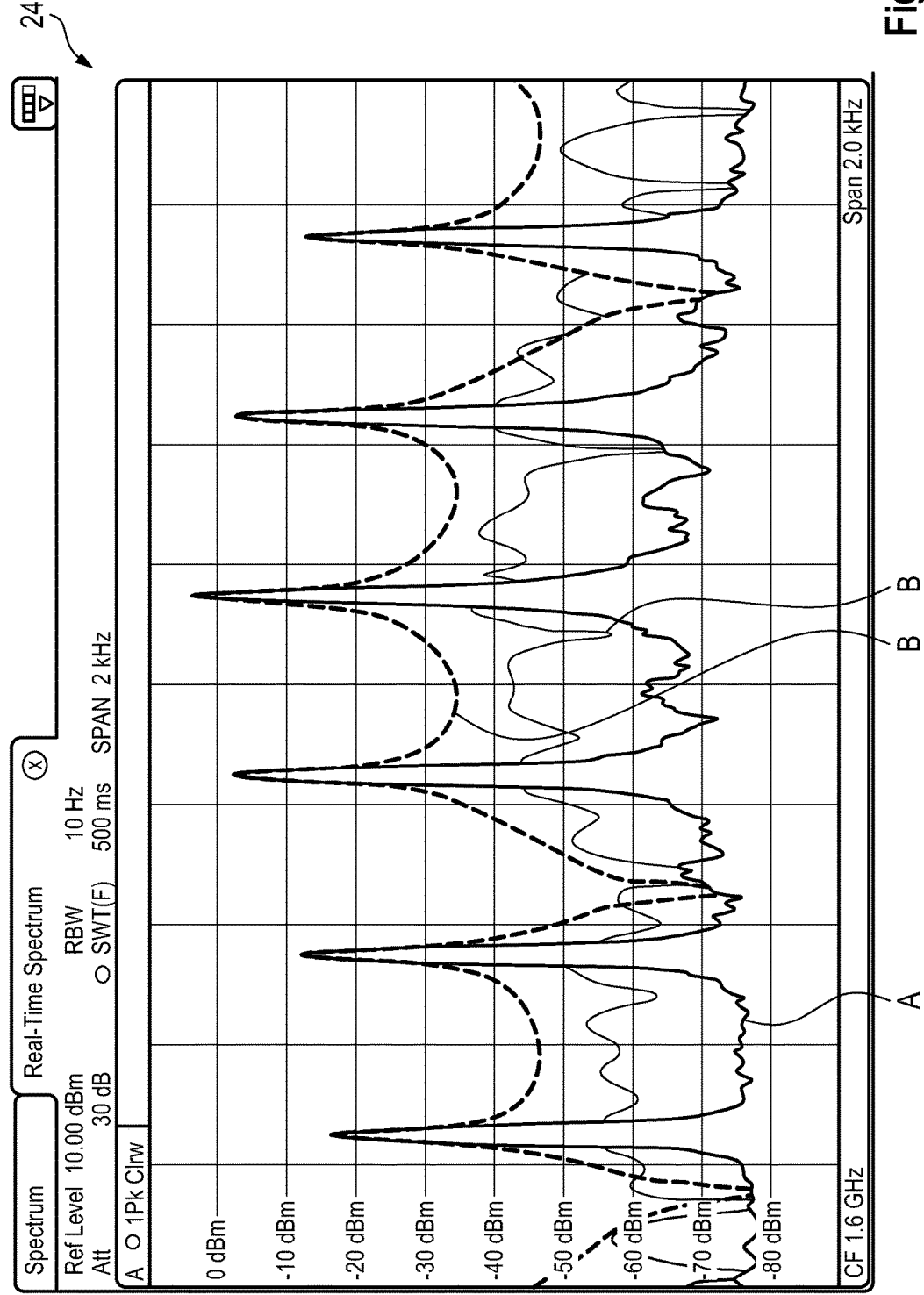
FIG. 2 shows a real time spectrum recorded during a testing method according to the invention.

Particularly, the indication unit 24 comprises a display for displaying the received spectrum of the output signal in real time. Such a real time spectrum is shown in FIG. 2.

The diagram representing the time spectrum shows the power level of the output signal A generated by the device under test 20, in particular in a transmission line of the satellite. The output signal has several carriers (peaks in the power level) wherein gaps are provided between the carriers aside from noise being up to −60 dBm in the shown real time spectrum.

Further, occurring multipaction B is visible as the gaps between the different carriers are filled up due to the energy of the secondary electrons causing the power level to rise, for instance up to −30 dBm. Hence, an occasionally arising massive spectral growth between the different carriers occurs due to the multipactor effect. As can be seen, the occurring multipaction B has a big influence on the spectrum, in particular with regard to the noise.

As the receiving unit 14 and the analyzing unit 16 are operated in real time, the user of the testing system 10 can directly identify the occurrence of the multipaction and stop the testing (system 10) by checking at least one of the indication unit 24 and the analyzing unit 16.

Furthermore, at least one threshold value may be provided in the receiving unit 14 or the analyzing unit 16. Alternatively, both units 14, 16 may have a threshold value.

The threshold value can be a power level such that the threshold value is used for automatically identifying the occurrence of the multipaction as the arising massive spectral regrowth between the carriers leads to a certain power level which may reach or even exceed the predefined threshold value. Accordingly, the threshold value may be limited to the frequency span between two neighbored carriers.

The indication unit 24 may further be configured to trigger the power level with regard to said threshold value during the testing. Accordingly, the testing may be stopped once the threshold value has been reached or exceeded. Accordingly, the indication unit 24, in particular the analyzing unit 16, is connected to the signal generation unit 12 and/or other components of the testing system 10 in order to shut down the testing system 10 once the threshold value is reached or exceeded.

For instance, two different threshold values may be provided wherein the first threshold value corresponds to a warning that shall warn the user of the testing system 10. A second threshold value having a higher power level may be provided for stopping the testing system 10 or the testing. Thus, the user is initially warned by the arising power level due to the occurrence of multipaction. In case that the power level caused by the occurrence of the multipaction further arises and the user has not stopped the testing system 10 or the testing manually, the testing system 10 or the testing is stopped automatically provided that the second threshold value is reached or exceeded.

In the shown embodiment, the testing system 10 also comprises two different condition changing units 26, namely a temperature changing unit 28 and a pressure changing unit 30. Both changing units 28, 30 are used for adjusting the temperature and pressure inside the thermal vacuum chamber 18 to the desired testing scenario. For instance, the condition changing units 26 may be used to change the temperature and/or pressure during the testing in order to simulate a journey of the satellite (changing temperatures), for instance.

Generally, the testing system 10 as well as the testing method provides an improvement in testing satellites inside thermal vacuum chambers since the occurrence of multipaction can be detected in real time. Thus, the testing procedure can be stopped at an early stage ensuring that the device under test 20 and/or the testing system 10 will not be damaged. In addition, the testing time inside the thermal vacuum chamber 18 can be reduced.

Moreover, a high bandwidth can be driven due to the fact that a multi-tone signal is used for testing.

The invention claimed is:

1. A testing system configured to perform a multipaction test on a device under test, the testing system comprising:
   a signal generation unit configured to stimulate an input of said device under test, wherein said signal generation unit is configured to generate a testing signal for stimulating said input, and wherein said testing signal comprises at least two carriers simultaneously; and
   a receiving unit configured to receive and measure at least one output signal of said device under test in order to obtain data related to a multipaction occurrence, wherein said signal generation unit and said receiving unit are controlled such that both units are operated simultaneously.

2. The testing system according to claim 1, wherein said at least one output signal comprises at least two carriers simultaneously.

3. The testing system according to claim 1, wherein an analyzing unit is provided, said analyzing unit being connected to said receiving unit.

4. The testing system according to claim 3, wherein said analyzing unit is configured to analyze at least two carriers simultaneously.

5. The testing system according to claim 3, wherein at least one of said analyzing unit and said receiving unit is configured to be operated in real time.

6. The testing system according to claim 3, wherein at least one threshold value is provided in at least one of said analyzing unit and said receiving unit, said threshold value being a power level for multipaction.

7. The testing system according to claim 6, wherein an indication unit is provided that is configured to trigger the power level with regard to said threshold value during testing, in particular wherein said indication unit is configured to stop said testing system.

8. The testing system according to claim 1, wherein said testing signal generated has a bandwidth of at least 2 GHz, in particular 2.5 GHz and more.

9. The testing system according to claim 1, wherein said signal generation unit is configured to adjust a gap provided between said at least two carriers.

10. The testing system according to claim 1, wherein said signal generation unit is configured to generate an amplitude modulated signal used as said testing signal.

11. The testing system according to claim 1, wherein at least one condition changing unit is provided that is configured to change a condition for testing said device under test, in particular during testing said device under test.

12. The testing system according to claim 1, wherein a device under test is provided, in particular wherein said device under test is a satellite.

13. A method for testing a device under test, wherein a multipaction test is performed, comprising:
   a. generating a testing signal for stimulating an input of said device under test, said testing signal being a wideband multi tone signal, said testing signal being generated by a signal generation unit;
   b. transmitting the testing signal via a transmission antenna system; and
   c. receiving and measuring at least one output signal of said device under test by using a receiving unit, wherein said signal generation unit and said receiving unit are operated simultaneously, and said signal generation unit generates a testing signal that comprises at least two simultaneously generated carriers.

14. The method according to claim 13, wherein said at least one output signal comprises two carriers simultaneously.

15. The method according to claim 13, wherein said at least one output signal is analyzed by an analyzing unit.

16. The method according to claim 13, wherein an adjustable gap is set while generating said testing signal, said adjustable gap being provided between said at least two carriers of said testing signal.

17. The method according to claim 13, wherein at least one testing condition is set for said testing or changed during said testing, in particular the temperature and/or the pressure.

18. A method for testing a device under test, wherein a multipaction test is performed, comprising:
   a. generating a testing signal for stimulating an input of said device under test, said testing signal being generated by a signal generation unit,
   b. receiving and measuring at least one output signal of said device under test by using a receiving unit, wherein
      said signal generation unit and said receiving unit are operated simultaneously,
      said signal generation unit generates a testing signal that comprises at least two carriers generated simultaneously, and
      at least one threshold value is used for identifying an occurrence of multipaction during testing, said threshold value being a power level.

19. The method according to claim 18, wherein a warning is output when said threshold value is reached or exceeded.

20. The method according to claim 18, wherein said testing is stopped when said threshold value is reached or exceeded.

* * * * *